(12) United States Patent  
Park et al.

(10) Patent No.: US 9,117,992 B2  
(45) Date of Patent: Aug. 25, 2015

(54) APPARATUS FOR DRIVING PIEZO ACTUATOR AND METHOD OF DRIVING THE SAME

(71) Applicant: SAMSUNG ELECTRO-MECHANICS CO., LTD., Suwon, Gyunggi-do (KR)

(72) Inventors: Chan Woo Park, Gyunggi-do (KR); Joo Yul Ko, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 57 days.

(21) Appl. No.: 14/147,354

(22) Filed: Jan. 3, 2014

(65) Prior Publication Data

US 2015/0102750 A1 Apr. 16, 2015

(30) Foreign Application Priority Data

Oct. 15, 2013 (KR) .......................... 10-2013-0122772

(51) Int. Cl.
H01L 41/04 (2006.01)
(52) U.S. Cl.
CPC .................................... H01L 41/042 (2013.01)
(58) Field of Classification Search
CPC ...................................................... H02N 2/14
USPC ........................................... 318/116, 34, 558
See application file for complete search history.

(56) References Cited

U.S. PATENT DOCUMENTS 5,479,062 A * 12/1995 Yoshino ................... 310/316.03  
2010/0060966 A1 3/2010 Cheong et al.

FOREIGN PATENT DOCUMENTS

| KR | 1020030014253 A | 2/2003 |
| KR | 1020100030393 A | 3/2010 |
| WO | 02080352 A1 | 10/2002 |

* cited by examiner

*Primary Examiner* — David S Luo  
(74) *Attorney, Agent, or Firm* — NSIP Law

(57) ABSTRACT

There are provided an apparatus for driving a piezo actuator and a method of driving the same. The apparatus includes: a control unit generating a digital control signal and converting the digital control signal into an analog control signal; a driving unit amplifying and not inverting the analog control signal to generate a first driving signal and amplifying and inverting the analog control signal to generate a second driving signal, with respect to a predetermined common voltage, and applying the first and second driving signals to both terminals of a piezo actuator; and an offset determining unit determining an offset in the first and second driving signals based on a voltage according to a current flowing in the piezo actuator, wherein the control unit generates the digital control signal to have an intermediate level in a predetermined offset detection section.

13 Claims, 6 Drawing Sheets

APPARATUS FOR DRIVING PIEZO ACTUATOR AND METHOD OF DRIVING THE SAME

CROSS-REFERENCE TO RELATED APPLICATION

This application claims the benefit of Korean Patent Application No. 10-2013-0122772 filed on Oct. 15, 2013, with the Korean Intellectual Property Office, the disclosure of which is incorporated herein by reference.

BACKGROUND

The present disclosure relates to an apparatus for driving a piezo actuator and a method of driving the same.

Haptic technology is a tactile feedback technology in which users are provided with vibrations, force, or impacts, generated in various digital devices. Recently, as immersive user interface technology has evolved, haptic technology has not only provided feedback to a user to confirm that a signal has been received, but has also provided immersive feedback. In particular, HD haptic technology is being developed to implement immersive user interfaces. HD haptic technology provides realistic user experiences by using various frequency bands and rich three-dimensional vibrational patterns.

In implementing HD technology, a piezo-type actuator is preferable to a linear-type actuator since the former has a faster response speed, less noise, and a higher resonant bandwidth. In order to drive the piezo-type actuator, however, it is necessary to apply a sinusoidal signal, and the amplitude and frequency of the sinusoidal signal should be accurately controlled in order to precisely realize minute vibrations.

RELATED ART DOCUMENT (Patent Document 1) Korean Patent Laid-Open Publication No. 10-2010-0030393

SUMMARY

An aspect of the present disclosure may provide an apparatus for driving a piezo actuator and a method of driving the same capable of canceling an offset in driving signals applied to a piezo actuator by detecting voltage according to current in the piezo actuator.

According to an aspect of the present disclosure, an apparatus for driving a piezo actuator may include: a control unit generating a digital control signal and converting the digital control signal into an analog control signal; a driving unit amplifying and not inverting the analog control signal to generate a first driving signal and amplifying and inverting the analog control signal to generate a second driving signal, with respect to a predetermined common voltage, and applying the first and second driving signals to both terminals of a piezo actuator; and an offset determining unit determining an offset in the first and second driving signals based on a voltage according to a current flowing in the piezo actuator, wherein the control unit generates the digital control signal to have an intermediate level in a predetermined offset detection section.

The control unit may include: a control signal generating unit generating the digital control signal; and a digital-analog converting unit converting the digital control signal into the analog control signal.

The driving unit may include an amplifying unit amplifying and not inverting the analog control signal to generate the first driving signal and amplifying and inverting the analog control signal to generate the second driving signal.

The amplifying unit may include: a first operational amplifier having an inverting input to which the common voltage is applied and a non-inverting input to which the analog control signal is applied; and a second operational amplifier having a non-inverting input to which the common voltage is applied and an inverting input to which the analog control signal is applied.

A voltage level of the analog control signal generated according to the digital control signal having the middle level may be equal to that of the common voltage.

The control unit may adjust a level of the digital control signal according to an offset signal provided from the offset determining unit.

The driving unit may further include a filter unit filtering the analog control signal.

The offset determining unit may include: an offset detecting unit including a first resistor disposed between a first output terminal of the driving unit from which the first driving signal is output and one terminal of the piezo actuator, and a second resistor disposed between a second output terminal of the driving unit from which the second driving signal is output and the other terminal of the piezo actuator; and an offset determining unit comparing voltages across the first and second resistors with each other so as to generate an offset signal.

The offset determining unit may include: an analog-digital converting unit individually converting the voltages detected from the first and second resistors into digital signals; and an offset signal generating unit comparing levels of two digital signals output from the analog-digital converting unit with each other so as to generate the offset signal.

According to another aspect of the present disclosure, a method of driving a piezo actuator may include: generating a digital control signal having an intermediate level; converting the digital control signal having the intermediate level into an analog control signal; amplifying and not inverting the analog control signal to generate a first driving signal, and amplifying and inverting the analog control signal to generate a second driving signal, with respect to a predetermined common voltage, to provide the first and second driving signals to a piezo actuator; and detecting a voltage according to a current flowing in the piezo actuator so as to determine an offset in the first and second driving signals.

The method may further include adjusting a level of the digital control signal according to the offset in the first and second driving signals.

A voltage level of the analog control signal generated according to the digital control signal having the middle level may be equal to that of the common voltage.

The determining of the offset in the first and second driving signals may include: detecting two voltages from both terminals of the piezo actuator; individually converting the two voltages into two digital signals; and comparing levels of the two digital signals with each other so as to generate an offset signal.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
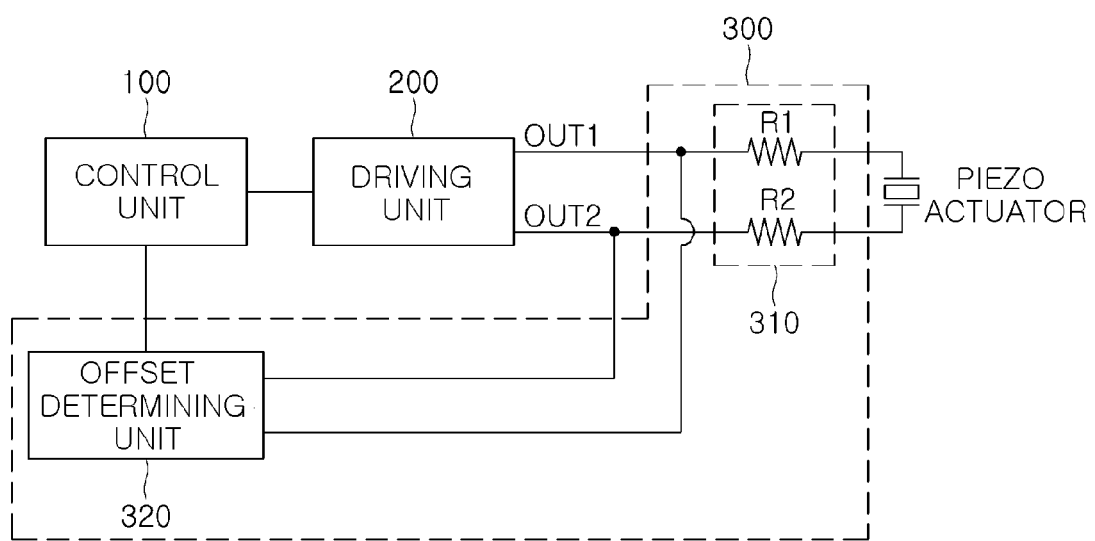
FIG. 1 is a block diagram illustrating an apparatus for driving a piezo actuator according to an exemplary embodiment of the present disclosure.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. Throughout the drawings, the same or like reference numerals will be used to designate the same or like elements.

Figure 2:
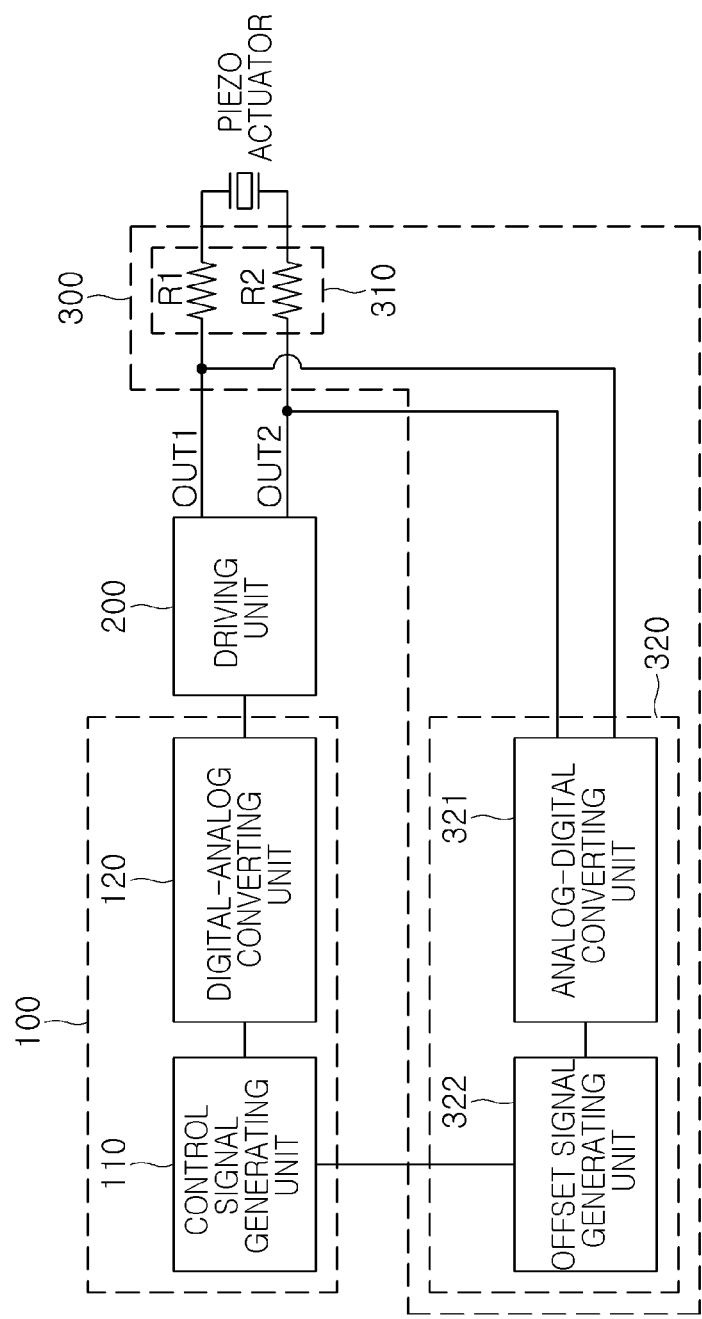
FIG. 2 is a block diagram illustrating the apparatus for driving a piezo actuator according to the exemplary embodiment of FIG. 1 in more detail.

FIG. 1 is a block diagram illustrating an apparatus for driving a piezo actuator according to an exemplary embodiment of the present disclosure, and FIG. 2 is a block diagram illustrating the apparatus for driving a piezo actuator according to the exemplary embodiment of FIG. 1 in more detail. Hereinafter, an apparatus for driving a piezo actuator according to an exemplary embodiment of the present disclosure will be described with reference to FIGS. 1 and 2.

The apparatus for driving a piezo actuator according to the exemplary embodiment may include a control unit 100, a driving unit 200, and an offset determining unit 300.

The control unit 100 may generate a control signal to provide it to the driving unit 200. After generating a control signal in the form of digital signal, i.e., a digital control signal, the control unit 100 may convert it to a control signal in the form of analog signal, i.e., an analog control signal, so as to provide it to the driving unit 200. The driving unit 200 may drive a piezo actuator according to the analog control signal. The analog control signal 200 may be a voltage signal.

The control unit 100 may include a control signal generating unit 110 and a digital-analog converting unit 120. The control signal generating unit 110 may generate a digital control signal and the digital-analog converting unit 120 may convert the digital control signal from the control signal generating unit 110 into an analog control signal. The control signal generating unit 110 may generate a digital signal of predetermined bits, for example, 10 bits.

The digital-analog converting unit 120 may generate an analog control signal in the form of voltage depending on the level of a digital control signal. Specifically, the digital-analog converting unit 120 may generate an analog control signal having the amplitude of zero if the level of a digital control signal is at an intermediate level, may generate an analog control signal having the amplitude of the maximum minus value if the level of the digital control signal is at the minimum level, and may generate an analog control signal having the amplitude of the maximum plus value if the level of the digital control signal is at the maximum level.

For example, in the case that a digital control signal is a digital signal of 10 bits and the digital-analog converting unit 120 may output an analog control signal having a level in the range of −100V to +100V, the digital-analog converting unit 120 may output an analog control signal having the level of −100V if it receives the digital control signal of 0 bits, may output an analog control signal having the level of zero if it receives the digital control signal of 512 bits, and may output an analog control signal having the level of +100V if it receives the digital control signal of 1023 bits.

The driving unit 200 may drive a piezo actuator after filtering the analog control signal and then amplifying it or amplifying the analog control signal and then filtering it. The driving unit 200 may apply a first driving signal, which has been amplified and not inverted, and a second driving signal, which has been amplified and inverted, to the two terminals of the piezo actuator, respectively, to drive the actuator. That is, the driving unit 200 may output two driving signals having the phase difference of 180 degrees therebetween.

The first driving signal may be output from a first output terminal OUT1 of the driving unit 200 and the second driving signal may be output from a second output terminal OUT2 of the driving unit 200.

Figure 3:
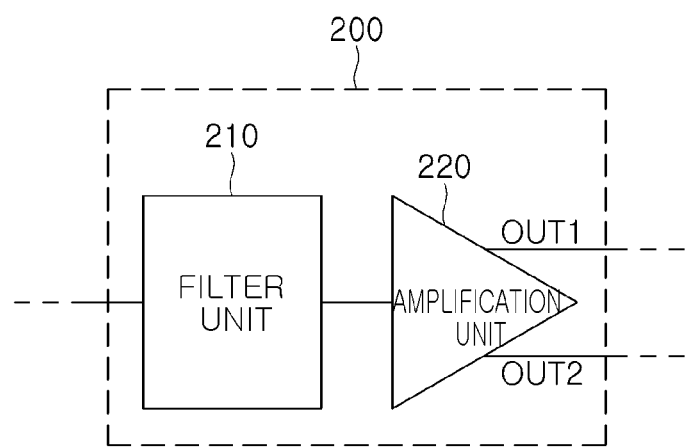
FIG. 3 is a block diagram of a driving unit according to an exemplary embodiment of the present disclosure.
Figures 4A, 4B:
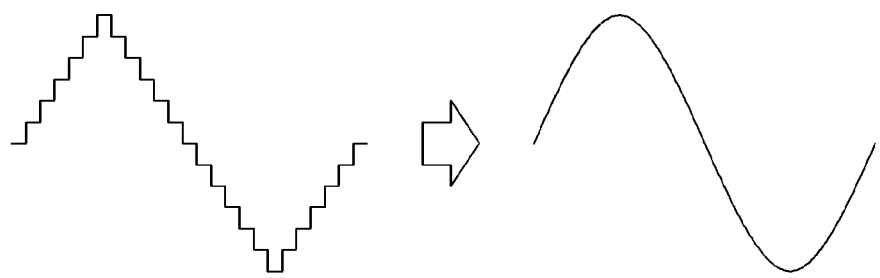
FIG. 4A is a graph illustrating an analog control signal output from a digital-analog converting unit.
FIG. 4B is a graph illustrating a signal output from a filter unit.

FIG. 3 is a block diagram of a driving unit according to an exemplary embodiment of the present disclosure, FIG. 4A is a graph illustrating an analog control signal output from a digital-analog converting unit, and FIG. 4B is a graph illustrating a signal output from a filter unit.

The driving unit 200 may include a filter unit 210 and an amplification unit 220. The filter unit 210 may include a filter circuit to filter an input analog control signal. Specifically, referring to FIG. 4A, levels of an analog control signal may vary in the form of steps within a predetermined range in accordance with a digital control signal having sequentially increasing or decreasing bits. The filter unit 210 may filter the analog control signal of FIG. 4A to output the signal illustrated in FIG. 4B.

The amplification unit 220 may amplify and not invert a signal output from the filter unit 210 to generate a first driving signal and amplify and invert the signal output from the filter unit 210 to generate a second driving signal, to output the first and second driving signals through first and second output terminals OUT1 and OUT2, respectively.

Figure 5:
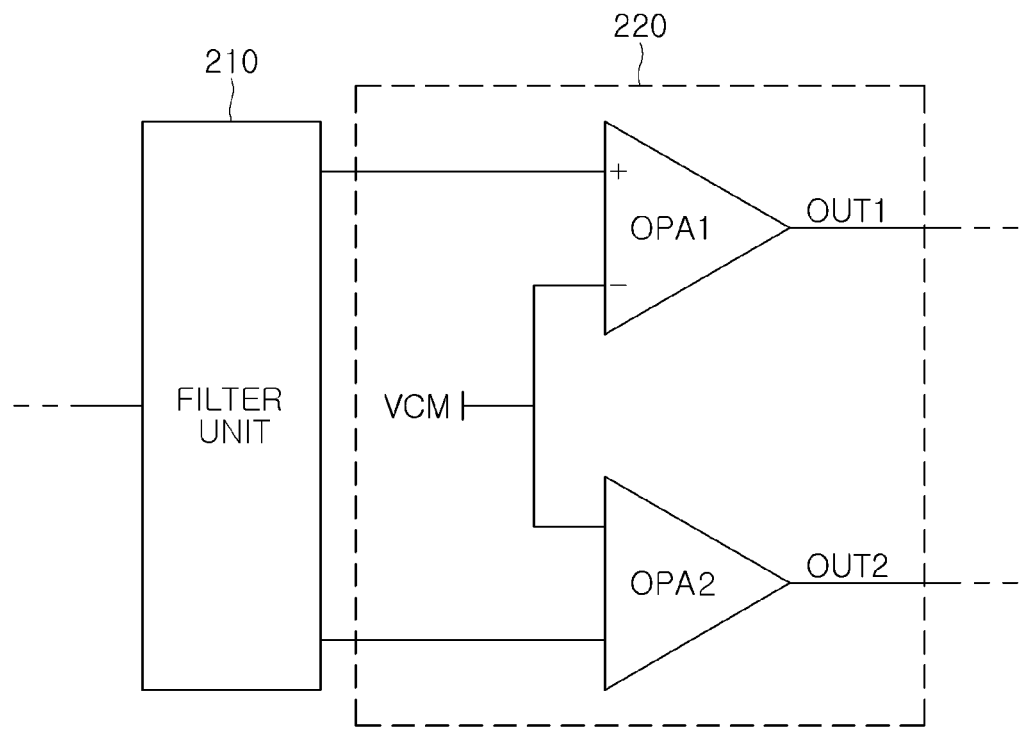
FIG. 5 is a block diagram illustrating the driving unit of FIG. 3 in detail.

FIG. 5 is a block diagram illustrating the driving unit of FIG. 3 in detail. Referring to FIG. 5, the amplification unit 220 may include first and second operational amplifiers OPA1 and OPA2. The common voltage VCM is applied to the inverting input of the first operational amplifier OPA1 and a signal output from the filter unit 210 is applied to the non-inverting input thereof. In addition, the common voltage VCM is applied to the non-inverting input of the second operational amplifier OPA2 and a signal output from the filter unit 210 is applied to the inverting input thereof. The first and second operational amplifiers OPA1 and OPA2 may amplify and not invert a signal output from the filter unit 210 to generate a first driving signal and may amplify and invert the signal output from the filter unit 210 to generate a second driving signal.

The first and second driving signals, which are generated by amplifying and not inverting and by amplifying and inverting an analog control signal, respectively, may be signals having opposite phases and the same amplitude. If an error occurs in at least one of the first and second operational amplifiers OPA1 and OPA2, an offset may occur in at least one of the first and second driving signals.

If an offset occurs, not only the first and second driving signals may have different amplitudes, but also two driving signals may have the same phase in a certain bit area of the digital control signal. Accordingly, a piezo actuator may not be precisely driven, and an error may occur.

The apparatus for driving a piezo actuator according to an exemplary embodiment of the present disclosure may employ an offset determining unit 300 so as to cancel an offset possibly occurring in at least one of the first and second driving signals.

Referring back to FIGS. 1 and 2, the offset determining unit 300 may include an offset detecting unit 310 and an offset determining unit 320, to detect and determine an offset in at least one of the first and second driving signals provided from a piezo actuator and generates an offset signal to correct the offset in the first and second driving signals.

The offset detecting unit 310 may include first and second resistors R1 and R2. The first resistor R1 may be disposed between the first output terminal OUT1 of the driving unit 200 and one terminal of the piezo actuator, and the second resistor R2 may be disposed between the second output terminal OUT2 of the driving unit 200 and the other terminal of the piezo actuator. Voltages across the first and second resistors R1 and R2 may be detected based on currents flowing in the piezo actuator and may be provided to the offset determining unit 320.

The offset determining unit 320 may compare voltage levels between the first and second resistors R1 and R2 so as to create an offset signal. The offset determining unit 320 may compare the voltage across the first resistor R1 with the voltage across the second resistor R2 and then convert the comparison result into a digital signal to generate an offset signal. Alternatively, the offset determining unit 320 may individually convert the voltage across the first resistor R1 with the voltage across the second resistor R2 into digital signals and then compare the two digital signals with each other to generate an offset signal.

The offset determining unit 320 may include an analog-digital converting unit 321 and an offset signal generating unit 322.

The analog-digital converting unit 321 may individually convert the voltages detected from the first and second resistors R1 and R2 into digital signals, to deliver them to the offset signal generating unit 322. The offset signal generating unit 322 may generate an offset signal based on a difference in levels between the two digital signals generated according to the voltages across the first and second resistors R1 and R2. The offset signal may be delivered to the control signal generating unit 110, and the control signal generating unit 100 may correct the digital control signal based on the offset signal.

The offset determining unit 320 may provide the offset signal to the control unit 100, and the control unit 100 may correct the digital value of the digital control signal based on the offset signal.

The control signal generating unit 100 according to this exemplary embodiment may generate a scan signal, which is a digital control signal that may be converted into an analog control signal having the same level of voltage as the common voltage VCM in a section for correcting an offset in first and second driving signals, i.e., an offset correction period. For example, if the voltage level of the common voltage VCM is zero, the control signal generating unit 110 may generate a scan signal which is a digital control signal having an intermediate level. For example, if the digital control signal is a signal having 10 bits, the scan signal may be a digital signal having 512 levels. As a result, a voltage having the same voltage level as the common voltage VCM may be applied to the non-inverting input of the first operational amplifier OPA1 and the inverting input of the second operational amplifier OPA2.

At this time, if there is no offset in the first and second driving signals, the same voltage is output from the output of the first and second operational amplifiers OPA1 and OPA2. As a result, there is no potential difference across the piezo actuator and thus no current flows in the piezo actuator, so that no voltage is detected from the first and second resistors R1 and R2. Accordingly, the offset signal generating unit 322 may determine that there is no offset and generate an offset signal accordingly.

On the contrary, if there is an offset in the first and second driving signals, there is a potential difference across the piezo actuator, so that a current flows in the piezo actuator due to the potential difference. Accordingly, voltages across the first and second resistors R1 and R2 may be detected based on currents flowing in the piezo actuator, and the analog-digital converting unit 321 may generate two digital signals corresponding to the detected voltages.

The offset signal generating unit 322 may generate a positive or negative offset signal for correcting an offset according to a difference in levels between two digital signals.

For example, as a result of analyzing two digital signals, if the voltage detected from the first resistor R1 is higher than the voltage detected from the second resistor R2, a positive offset signal may be generated, and otherwise a negative offset signals may be generated.

The control signal generating unit 110 may correct an offset in the first and second driving signals by adjusting the middle level of the digital control signal according to the offset signal provided from the offset signal generating unit 322.

Figure 6:
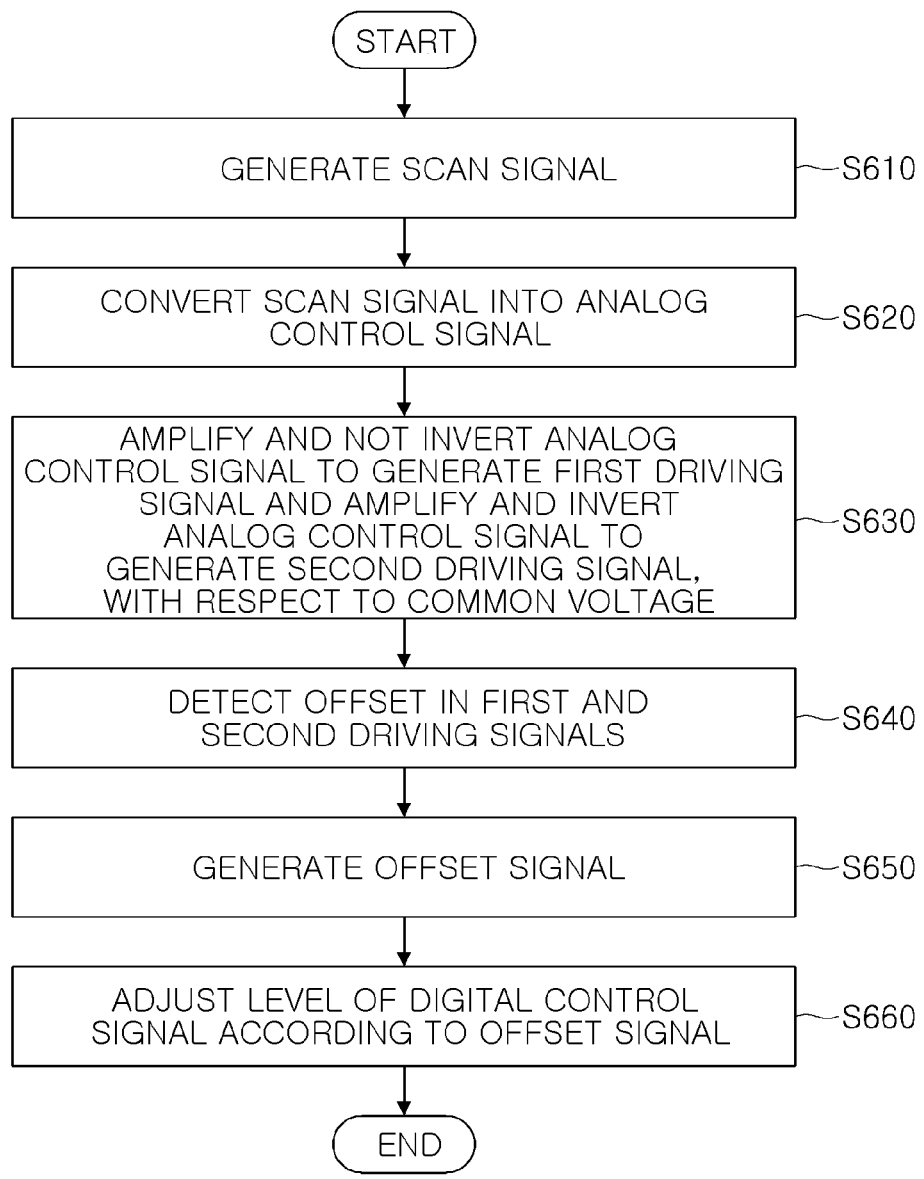
FIG. 6 is a flow chart illustrating a method of driving a piezo actuator according to an exemplary embodiment of the present disclosure.

FIG. 6 is a flow chart illustrating a method of driving a piezo actuator according to an exemplary embodiment of the present disclosure. Specifically, the flow chart illustrates a method of correcting an offset performed by the apparatus for driving a piezo actuator according to an exemplary embodiment of the present disclosure. The method of correcting an offset in an apparatus for driving a piezo actuator according to the exemplary embodiment is to correct an offset in a driving signal due to an error in a process of manufacturing a driving unit 200 employed in an apparatus for driving a piezo actuator. The method of correcting an offset according to the exemplary embodiment may be performed in an offset correction section which may be set when the piezo actuator is initially driven or at regular intervals.

Hereinafter, the method of correcting an offset according to the exemplary embodiment will be described with reference to FIGS. 1 through 6.

The control signal generating unit 210 may generate a scan signal which is a digital control signal to have an intermediate level (S610), and the digital-analog converting unit 120 may convert the scan signal into an analog control signal (S620), in which the generated analog control signal may have the same level as the common voltage (VCM).

The first and second operational amplifier (OPA1 and OPA2) may amplify and not invert the analog control signal to generate the first driving signal and amplify and invert the analog control signal to generate the second driving signal, with respect to the common voltage VCM (S630). Voltages across the first and second resistors R1 and R2 may be detected based on currents flowing in the piezo actuator so that an offset in the first and second driving signals may be detected (S640).

The offset determining unit 320 may compare the voltage detected from the first resistor R1 with the voltage detected from the second resistor R2 to generate an offset signal containing information on whether an offset signal is present in the first and second driving signals and on the magnitude thereof (S650). For example, if the voltage detected from the first resistor R1 is equal to the voltage detected from the second resistor R2, it is determined that no offset is present so that an offset signal is generated accordingly. If the voltage detected from the first resistor R1 is higher than the voltage detected from the second resistor R2, a positive offset signal may be generated, and otherwise a negative offset signal may be generated.

Then, the control signal generating unit 110 may adjust the level of the digital control signal according to the offset signal (S660).

As set forth above, according to exemplary embodiment of the present disclosure, an offset in driving signals applied to a piezo actuator is cancelled by detecting voltage according to current in the piezo actuator, so that driving reliability of a piezo actuator may be improved.

While exemplary embodiments have been shown and described above, it will be apparent to those skilled in the art that modifications and variations could be made without departing from the spirit and scope of the present disclosure as defined by the appended claims.

What is claimed is:

1. An apparatus for driving a piezo actuator, comprising:
   a control unit generating a digital control signal and converting the digital control signal into an analog control signal;
   a driving unit amplifying and not inverting the analog control signal to generate a first driving signal and amplifying and inverting the analog control signal to generate a second driving signal, with respect to a predetermined common voltage, and applying the first and second driving signals to both terminals of a piezo actuator; and
   an offset determining unit determining an offset in the first and second driving signals based on a voltage according to a current flowing in the piezo actuator,
   wherein the control unit generates the digital control signal to have an intermediate level in a predetermined offset detection section.

2. The apparatus of claim 1, wherein the control unit includes: a control signal generating unit generating the digital control signal; and a digital-analog converting unit converting the digital control signal into the analog control signal.

3. The apparatus of claim 2, wherein the driving unit includes an amplifying unit amplifying and not inverting the analog control signal to generate the first driving signal and amplifying and inverting the analog control signal to generate the second driving signal.

4. The apparatus of claim 3, wherein the amplifying unit includes: a first operational amplifier having an inverting input to which the common voltage is applied and a non-inverting input to which the analog control signal is applied; and a second operational amplifier having a non-inverting input to which the common voltage is applied and an inverting input to which the analog control signal is applied.

5. The apparatus of claim 4, wherein a voltage level of the analog control signal generated according to the digital control signal having the intermediate level is equal to that of the common voltage.

6. The apparatus of claim 3, wherein the driving unit further includes a filter unit filtering the analog control signal.

7. The apparatus of claim 2, wherein the control unit adjusts a level of the digital control signal according to an offset signal provided from the offset determining unit.

8. The apparatus of claim 1, wherein the offset determining unit includes:
   an offset detecting unit including a first resistor disposed between a first output terminal of the driving unit from which the first driving signal is output and one terminal of the piezo actuator, and a second resistor disposed between a second output terminal of the driving unit from which the second driving signal is output and the other terminal of the piezo actuator; and
   an offset determining unit comparing voltages across the first and second resistors with each other so as to generate an offset signal.

9. The apparatus of claim 8, wherein the offset determining unit includes:
   an analog-digital converting unit individually converting the voltages detected from the first and second resistors into digital signals; and
   an offset signal generating unit comparing levels of two digital signals output from the analog-digital converting unit with each other so as to generate the offset signal.

10. A method of driving a piezo actuator, comprising:
    generating a digital control signal having an intermediate level;
    converting the digital control signal having the intermediate level into an analog control signal;
    amplifying and not inverting the analog control signal to generate a first driving signal, and amplifying and inverting the analog control signal to generate a second driving signal, with respect to a predetermined common voltage, to provide the first and second driving signals to a piezo actuator; and
    detecting a voltage according to a current flowing in the piezo actuator so as to determine an offset in the first and second driving signals.

11. The method of claim 10, further comprising adjusting a level of the digital control signal according to the offset in the first and second driving signals.

12. The method of claim 10, wherein a voltage level of the analog control signal generated according to the digital control signal having the middle level is equal to that of the common voltage.

13. The method of claim 10, wherein the determining of the offset in the first and second driving signals includes:
    detecting two voltages from both terminals of the piezo actuator;
    individually converting the two voltages into two digital signals; and
    comparing levels of the two digital signals with each other so as to generate an offset signal.

* * * * *